United States Patent
Sasaki et al.

(10) Patent No.: US 6,399,409 B2
(45) Date of Patent: Jun. 4, 2002

(54) METHOD FOR FABRICATING SEMICONDUCTOR LIGHT EMITTING ELEMENT

(75) Inventors: Kazuaki Sasaki, Osaka; Junichi Nakamura, Tenri, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/839,114

(22) Filed: Apr. 23, 2001

Related U.S. Application Data

(62) Division of application No. 09/015,052, filed on Jan. 28, 1998, now Pat. No. 6,246,078.

(30) Foreign Application Priority Data

Jan. 29, 1997 (JP) ............................................. 9-014906

(51) Int. Cl.⁷ .................... H01L 21/00; H01L 21/20; H01L 21/28
(52) U.S. Cl. ................. 438/46; 438/47; 438/483; 438/518; 438/590; 438/604
(58) Field of Search .................... 257/91, 94, 96; 438/483, 46, 47, 518, 590, 604, 605, 779; 372/45

(56) References Cited

U.S. PATENT DOCUMENTS

| | | | |
|---|---|---|---|
| 4,987,096 A | | 1/1991 | Ishikawa et al. ............ 437/129 |
| 5,008,718 A | | 4/1991 | Fletcher et al. ............... 357/17 |
| 5,537,433 A | * | 7/1996 | Watanabe ..................... 372/45 |
| 5,635,733 A | | 6/1997 | Okagawa et al. ............. 257/94 |
| 5,656,829 A | | 8/1997 | Sakaguchi et al. ........... 257/94 |
| 5,661,742 A | | 8/1997 | Huang et al. ................. 257/97 |
| 5,698,865 A | * | 12/1997 | Gerner et al. ................. 257/94 |
| 5,744,829 A | * | 4/1998 | Murasato et al. ............. 257/94 |
| 5,777,349 A | * | 7/1998 | Nakamura et al. ........... 257/94 |
| 5,814,839 A | * | 9/1998 | Hosoba ........................ 257/96 |
| 5,861,636 A | * | 1/1999 | Dutta et al. ................... 257/91 |

FOREIGN PATENT DOCUMENTS

| | | | |
|---|---|---|---|
| DE | 195 31 762 A1 | 3/1996 | |
| EP | 0 334 637 A2 | 9/1989 | |
| JP | 5-41537 A | 2/1993 | |
| JP | 5-343736 A | 12/1993 | |
| JP | 08-316574 | * 11/1996 | ............. H01S/3/18 |
| JP | 9-74221 A | 3/1997 | |

* cited by examiner

Primary Examiner—George Fourson
Assistant Examiner—William David Coleman
(74) Attorney, Agent, or Firm—Nixon & Vanderhye P.C.

(57) ABSTRACT

The semiconductor light emitting element of the present invention includes: a compound semiconductor substrate having a first conductivity type; a light emitting layer; a compound semiconductor interface layer having a second conductivity type and not containing Al; and a current diffusion layer having the second conductivity type and being made of a compound semiconductor not containing Al.

10 Claims, 8 Drawing Sheets

1300

METHOD FOR FABRICATING SEMICONDUCTOR LIGHT EMITTING ELEMENT

This application is a divisional of application Ser. No. 09/015,052, filed Jan. 28, 1998, now U.S. Pat. No. 6,246,078, the contents of which are incorporated herein in their entirety.

BACKGROUND OF THE INVENTION

1. Field of the Invention

The present invention relates to a semiconductor light emitting element. More particularly, the present invention relates to a structure of, and a method for fabricating, a quadruple alloy light emitting diode (LED) made of a quadruple alloy material of AlGaInP for constituting a high-luminescence LED which emits light in a red to green band.

2. Description of the Related Art

In recent years, a high-luminance quadruple alloy LED made of AlGaInP has become the object of particular attention as a light emitting element for various types of display devices for indoor use and outdoor use. A quadruple alloy material allows for the fabrication of an LED which emits light in a wide visible wavelength region ranging from a red to green band.

A typical structure of a conventional quadruple alloy LED 1100 for a yellow band is shown in FIGS. 7A and 7B: FIG. 7A is a perspective view thereof; and FIG. 7B is a schematic cross-sectional view thereof.

In this structure, an n-$(Al_{0.7}Ga_{0.3})_{0.5}In_{0.5}P$ cladding layer 51 (doped with Si, carrier concentration: about $5\times10^{17}$ cm$^{-3}$, thickness: about 1.5 µm), a non-doped $(Al_{0.3}Ga_{0.7})_{0.5}In_{0.5}P$ active layer 52 (thickness: about 0.7 µm), a p-$(Al_{0.7}Ga_{0.3})_{0.5}In_{0.5}P$ cladding layer 53 (doped with Zn, carrier concentration: about $5\times10^{17}$ cm$^{-3}$, thickness: about 1.5 µm), a p-$Al_{0.7}Ga_{0.3}As$ current diffusion layer 54 (doped with Zn, carrier concentration: about $3\times10^{18}$ cm$^3$, thickness: about 5 µm), and a p-GaAs ohmic contact layer 55 (doped with Zn, carrier concentration: about $3\times10^{18}$ cm$^{-3}$, thickness: about 0.5 µm) are sequentially formed in this order on an n-GaAs substrate 50 by metal organic chemical vapor deposition (MOCVD). In addition, lower and upper electrodes 56 and 57 are formed on the reverse surface of the substrate 50 and on the top surface of the grown layered structure, respectively. The upper electrode 57 on the top surface of the grown layered structure, as well as the p-GaAs ohmic-contact layer 55, have been patterned so as to be in a circular shape in the center region of the top surface of the structure. Portions of the upper electrode 57 and the pGaAs ohmic contact layer 55 have been removed by performing an etching, leaving the circular-shaped portions remaining in the center region.

An axial luminous intensity (unit: candela (cd)) of a molded LED element is one of the indices representing the luminescence of the LED. In the conventional LED 1100 shown in FIGS. 7A and 7B, when the axial spread angle of the emitted light is about ±4 degrees with an operating voltage of about 2.0 V and a drive current of about 20 mA, the axial luminous intensity is about 8 cd.

The apparent axial luminous intensity is increased as the light concentration characteristics of an LED are improved (i.e., as the axial spread range of the emitted light is smaller). Moreover, an LED having improved light concentration characteristics can be advantageously used for communication applications.

Another conventional LED 1200, for communication, is shown in FIGS. 8A and 8B: FIG. 8A is a perspective view thereof; and FIG. 8B is a schematic cross-sectional view taken along the line 8B–8B' of the LED 1200 shown in FIG. 8A. The conventional LED 1200 shown in FIGS. 8A and 8B is an AlGaInP alloy system LED for a yellow band and has the following structure.

As shown in the schematic cross-sectional view in FIG. 8B, an n-$(Al_{0.7}Ga_{0.3})_{0.5}In_{0.5}P$ cladding layer 51 (doped with Si, carrier concentration: about $1\times10^{18}$ cm$^{-3}$, thickness: about 1.0 µm), a non-doped $(Al_{0.3}Ga_{0.7})_{0.5}In_{0.5}P$ active layer 52 (thickness: about 0.6 µm), a p-$(Al_{0.7}Ga_{0.3})_{0.5}In_{0.5}P$ cladding layer 53 (doped with Zn, carrier concentration: about $1\times10^{18}$ cm$^{-3}$, thickness: about 1.0 µm), an n-$(Al_{0.7}Ga_{0.3})_{0.5}In_{0.5}P$ current constriction layer 58 (doped with Si, carrier concentration: about $2\times10^{18}$ cm$^{-3}$, thickness: about 0.4 µm), a p-$Al_{0.7}Ga_{0.3}As$ current diffusion layer 54 (doped with Zn, carrier concentration: about $3\times10^{18}$ cm$^{-3}$, thickness: about 6 µm), and a p-GaAs ohmic contact layer 55 (doped with Zn, carrier concentration: about $3\times10^{18}$ cm$^3$, thickness: about 0.5 µm) are sequentially formed in this order on an n-GaAs substrate 50 by MOCVD.

The center region of the n-$(Al_{0.7}Ga_{0.3})_{0.5}In_{0.5}P$ current constriction layer 58 has been etched away in a circular shape to form a light emitting region, and the p-$Al_{0.7}Ga_{0.3}As$ current diffusion layer 54 is re-grown over the current constriction layer 58 including the etched and removed center region thereof. The reference numeral 59 denotes the re-growth interface.

In addition, lower and upper electrodes 56 and 57 are formed on the reverse surface of the substrate 50 and on the top surface of the grown layered structure, respectively. The upper electrode 57 and the p-GaAs ohmic contact layer 55 are formed in a doughnut shape in which the center regions thereof are etched away so as to have openings of the same size and shape as those of the etched and removed region of the current constriction layer 58.

In this conventional LED element 1200, an injected current flows in a concentrated manner into the center region, so that the reduced spot size of emitted light can be realized. As a result, the light concentration characteristics of the resulting element, which has been molded with a resin, can be improved and the axial luminous intensity thereof can be increased.

However, in the conventional LED 1200 shown in FIGS. 8A and 8B, the p-$Al_{0.7}Ga_{0.3}As$ current diffusion layer 54 is re-grown on the underlying p-$(Al_{0.7}Ga_{0.3})_{0.5}In_{0.5}P$ cladding layer 53 containing Al. Thus, oxygen is likely to be absorbed into the re-growth interface 59 (see FIG. 8B), resulting in various losses such as adversely increased resistance and non-radiative recombination of injected carriers.

The typical operational characteristics of such a conventional LED 1200 are as follows: the axial spread angle is about ±2 degrees and the luminescence is about 16 cd with the operating voltage of about 3.0 V when a power of about 20 mA is supplied thereto. As compared with the conventional LED 1100 shown in FIGS. 7A and 7B (which is made of the same quadruple alloy material and has the axial spread angle of about ±4 degrees and the luminescence of about 8 cd with the operating voltage of about 2.0 V when a power of about 20 mA is supplied thereto), the axial luminous intensity of the LED 1200 shown in FIGS. 8A and 8B is increased only by as little as twofold while the operating voltage is considerably increased. In the element 1200 shown in FIGS. 8A and 8B, the luminescence has been expected to be increased fourfold (i.e., about 32 cd) since the axial spread angle thereof is decreased to about ½ of that of the element 1100 shown in FIGS. 7A and 7B.

In order to solve such problems as set forth above, another conventional semiconductor light emitting element 1300 having such a structure as that shown in FIG. 9 has been suggested. The shape of the current constriction layer and the electrode on the top surface of the grown layered structure of the semiconductor light emitting element 1300 shown in FIG. 9 is the same as that of the element 1200 shown in FIGS. 8A and 8B.

As shown in the schematic cross-sectional view in FIG. 9, an n-$(Al_{0.7}Ga_{0.3})_{0.5}In_{0.5}P$ cladding layer 51 (doped with Si, carrier concentration: about $1\times10^{18}$ cm$^{-3}$, thickness: about 1.0 $\mu$m), a non-doped $(Al_{0.3}Ga_{0.7})_{0.5}In_{0.5}P$ active layer 52 (thickness: about 0.6 $\mu$m), and a p$(Al_{0.7}Ga_{0.3})_{0.5}In_{0.5}P$ cladding layer 53 (doped with Zn, carrier concentration: about $1\times10^{18}$ cm$^{-3}$ thickness: about 1.0 $\mu$m) are sequentially formed in this order on an n-GaAs substrate 50 by MOCVD. Next, unlike the conventional element 1200 shown in FIGS. 8A and 8B, a p-GaInP layer 60 (doped with Zn, carrier concentration: about $1\times10^{18}$ cm$^{-3}$, thickness: about 100 Å) not containing Al is formed on the p-$(Al_{0.7}Ga_{0.3})_{0.5}In_{0.5}P$ cladding layer 53 in the element 1300 shown in FIG. 9. Since the layer 60 functions as the underlying layer during the re-growth process, oxygen is less likely to be absorbed into the re-growth interface 59, and conditions of the re-growth interface 59 can be improved as compared with the conventional example 1200 shown in FIGS. 8A and 8B.

The remaining part of the element 1300 shown in FIG. 9 is the same as that of the element 1200 shown in FIG. 8B. Specifically, an n-$(Al_{0.7}Ga_{0.3})_{0.5}In_{0.5}P$ current constriction layer 58 (doped with Si, carrier concentration: about $2\times10^{18}$ cm$^3$, thickness: about 0.4 $\mu$m), a p-$Al_{0.7}Ga_{0.3}As$ current diffusion layer 54 (doped with Zn, carrier concentration: about $3\times10^{18}$ cm$^{-3}$ thickness: about 6 $\mu$m), and a p-GaAs ohmic contact layer 55 (doped with Zn, carrier concentration: about $3\times10^{18}$ cm$^{-3}$, thickness: about 0.5 $\mu$m) are sequentially formed in this order on the p-GaInP layer 60.

SUMMARY OF THE INVENTION

The semiconductor light emitting element of the present invention includes: a compound semiconductor substrate having a first conductivity type; a light emitting layer; a compound semiconductor interface layer having a second conductivity type and not containing Al; and a current diffusion layer having the second conductivity type and being made of a compound semiconductor not containing Al.

A current constriction layer having the first conductivity type and being made of a compound semiconductor not containing Al may be further provided between the compound semiconductor interface layer and the current diffusion layer.

A carrier concentration of the current diffusion layer may increase from a region thereof over the compound semiconductor interface layer toward a region thereof under an upper electrode.

The light emitting layer may have a double heterostructure in which an AlGaInP or AlInP cladding layer having the first conductivity type, an AlGaInP or GaInP active layer, and an AlGaInP or AlInP cladding layer having the second conductivity type are sequentially formed in this order.

A semiconductor layer providing a light reflection function may be further provided between the compound semiconductor substrate and the light emitting layer.

A band gap adjustment layer having an intermediate band gap may be further provided between the light emitting layer and the compound semiconductor interface layer.

A buffer layer may be further provided between the compound semiconductor substrate and the light emitting layer.

The compound semiconductor interface layer, the current constriction layer, and the current diffusion layer may be made of a GaP compound material. Preferable, the compound semiconductor interface layer, the current constriction layer, and the current diffusion layer are made of a GaP compound material of the same composition.

The current constriction layer may have an opening portion in a center portion of the semiconductor light emitting element.

Preferably, a thickness of the compound semiconductor interface layer is equal to or smaller than about 3.0 $\mu$m.

Preferably, the compound semiconductor interface layer has a carrier concentration in a range from about $2\times10^{16}$ cm$^{-3}$ to about $2\times10^{18}$ cm$^{-3}$, and the current diffusion layer has a carrier concentration of about $2\times10^{18}$ cm$^{-3}$ or more.

According to another aspect of the present invention, the method for fabricating such a semiconductor light emitting element having the above-mentioned features is provided. The method includes the steps of: forming the light emitting layer and the compound semiconductor interface layer containing no Al on the compound semiconductor substrate; and forming the current diffusion layer over the compound semiconductor interface layer. A growth process is suspended at a predetermined time so that a re-growth interface is located on a surface of the compound semiconductor interface layer.

Hereinafter, the functions and/or the effects to be attained by the present invention will be briefly described.

The present inventors found that the operating characteristics of the LED 1300 shown in FIG. 9 are still unsatisfactory. Specifically, the LED 1300 has the axial spread angle of about +2 degrees and a luminescence of about 24 cd with the operating voltage of about 2.4 V. The reasons for the above are presumably as follows.

In the LED 1300, the underlying layer for the re-growth process is the p-GaInP layer 60, while the re-grown layer 54 is the p-$Al_{0.7}Ga_{0.3}$As current diffusion layer 54. These layers 60 and 54 have different Group V elements, i.e., arsenic (As) in the layer 54 and phosphorus (P) in the layer 60. As a result, it is difficult to stoichiometrically match the layers 54 and 60. Furthermore, the conditions of the re-growth interface 59 are still satisfactory, resulting in a high-resistance layer. Consequently, the injected carriers are also lost to a large degree.

The present invention has been made in view of the above-mentioned findings by the present inventors.

When the present invention is applied to the semiconductor light emitting element of an AlGaInP alloy system, the semiconductor light emitting element of the present invention may include: a compound semiconductor substrate having the first conductivity type (n-GaAs); a buffer layer (n-GaAs); a light emitting layer (cladding layer/active layer/cladding layer); a compound semiconductor interface layer having the second conductivity type and not containing Al (p-GaP); a current constriction layer having the first conductivity type and being made of a compound semiconductor not containing Al (nGaP); and a current diffusion layer having the second conductivity type and being made of a compound semiconductor not containing Al (p-GaP).

The growth process is suspended so that the re-growth interface is located on the surface of the compound semiconductor interface layer which contains no Al. Thus, oxygen is not absorbed into the re-growth interface.

In addition, since the layers made of the same GaP material are formed with the re-growth interface interposed therebetween, no interface level resulting from a stoichiometric difference is generated.

Consequently, the present invention can provide a semiconductor light emitting element realizing a low resistance and a high luminescence.

Thus, the invention described herein makes possible the advantages of (1) providing a semiconductor light emitting element realizing a low resistance and a high luminescence in which no oxygen is absorbed into the re-growth interface between an underlying layer and a re-growth layer, preventing interface levels which result from the stoichiometric difference from being generated, and (2) providing a method for fabricating such a semiconductor light emitting element.

These and other advantages of the present invention will become apparent to those skilled in the art upon reading and understanding the following detailed description with reference to the accompanying figures.

BRIEF DESCRIPTION OF THE DRAWINGS

FIG. 1A is a schematic perspective view thereof; and

FIG. 1B is a schematic cross-sectional view thereof.

FIG. 3A is a schematic perspective view thereof; and

FIG. 3B is a schematic cross-sectional view thereof.

FIG. 7A is a schematic perspective view thereof; and

FIG. 7B is a schematic cross-sectional view thereof.

FIG. 8A is a schematic perspective view thereof; and

FIG. 8B is a schematic cross-sectional view thereof taken along line 8B–8B'.

DESCRIPTION OF THE PREFERRED EMBODIMENTS

Hereinafter, embodiments of the present invention will be described with reference to FIG. 1A through FIG. 6.

EXAMPLE 1

Figure 1A:
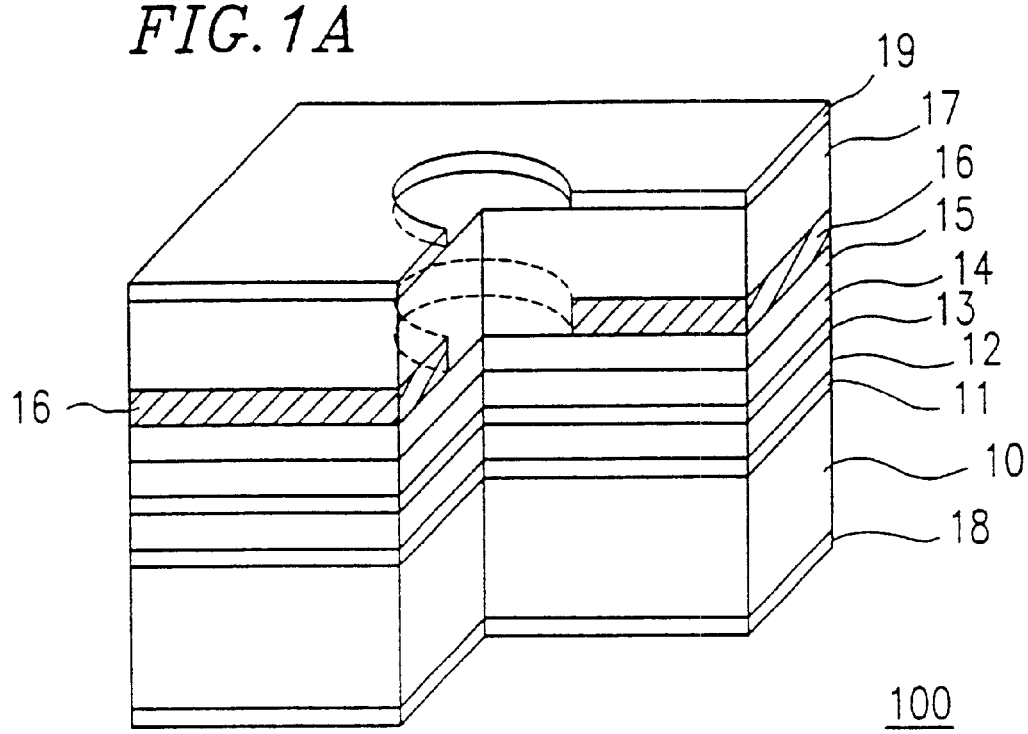
FIGS. 1A and 1B illustrate a semiconductor light emitting element in a first example of the present invention.
Figure 1B:
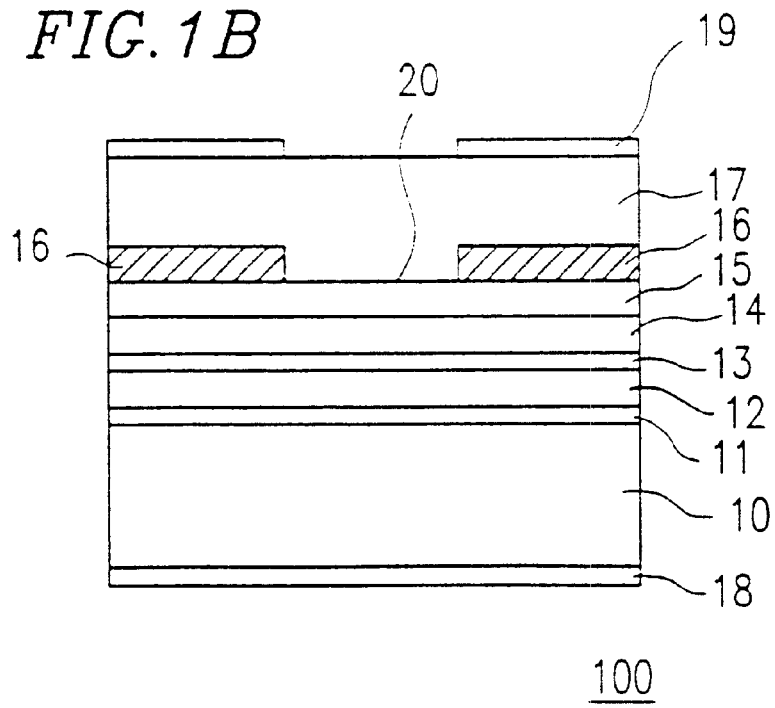

FIGS. 1A and 1B illustrate a semiconductor light emitting element 100 in the first example of the present invention: FIG. 1A is a schematic perspective view thereof; and FIG. 1B is a schematic cross-sectional view thereof.

As shown in FIG. 1A, an n-GaAs buffer layer 11 (doped with Si, carrier concentration: about $5\times10^{17}$ cm$^{-3}$, thickness: about 0.5 $\mu$m), an n-$(Al_{0.7}Ga_{0.3})_{0.5}In_{0.5}P$ cladding layer 12 (doped with Si, carrier concentration: about $5\times10^{17}$ cm$^{-3}$, thickness: about 1.5 $\mu$m), a non-doped $(Al_{0.3}Ga_{0.7})_{0.5}In_{0.5}P$ active layer 13 (thickness: about 0.7 $\mu$m), and a p-$(Al_{0.7}Ga_{0.3})_{0.5}In_{0.5}P$ cladding layer 14 (doped with Zn, carrier concentration: about $5\times10^{17}$ cm$^{-3}$, thickness: about 1.5 $\mu$m) are sequentially formed in this order on an n-GaAs substrate 10 by MOCVD. Next, a p-GaP interface layer 15 not containing Al (doped with Zn, carrier concentration: about $2\times10^{18}$ cm$^{-3}$ thickness: about 1.5 $\mu$m) and an n-GaP current constriction layer 16 (doped with Si, carrier concentration: about $1\times10^{18}$ cm$^{-3}$, thickness: about 0.5 $\mu$m) are formed, and the n-GaP current constriction layer 16 is subjected to a patterning process. Subsequently, a p-GaP current diffusion layer 17 (doped with Zn, carrier concentration: about $2\times10^{13}$ cm$^{-3}$, thickness: about 5 $\mu$m) is formed on the patterned current constriction layer 16. Finally, an n-electrode 18 and a p-electrode 19 are formed on the reverse surface of the substrate 10 and on the top surface of the grown layered structure, respectively.

Since the current diffusion layer 17 is a p-GaP layer having a high concentration, it is not necessary to form an ohmic contact layer. The n-GaP current constriction layer 16 has been etched so as to have a circular opening in the center portion thereof. The electrode 19 on the top surface of the grown layered structure also has a circular opening in the center portion thereof, which is shaped like a window for the egress of the emitted light.

The semiconductor light emitting element 100 in the first example of the present invention is fabricated in the following manner.

First, the n-GaAs buffer layer 11 (doped with Si, carrier concentration: about $5\times10^{17}$ cm$^{-3}$, thickness: about 0.5 $\mu$m), the n-$(Al_{0.7}Ga_{0.3})_{0.5}In_{0.5}P$ cladding layer 12 (doped with Si, carrier concentration: about $5\times10^{17}$ cm$^{-3}$, thickness: about 1.5 $\mu$m), the non-doped $(Al_{0.3}Ga_{0.7})_{0.5}In_{0.5}P$ active layer 13 (thickness: about 0.7 $\mu$m), the p-$(Al_{0.7}Ga_{0.3})_{0.5}In_{0.5}P$ cladding layer 14 (doped with Zn, carrier concentration: about $5\times10^{17}$ cm$^{-3}$, thickness: about 1.5 $\mu$m), the p-GaP interface layer 15 (doped with Zn, carrier concentration: about $2\times10^{18}$ cm$^{-3}$, thickness: about 1.5 $\mu$m), and the n-GaP current constriction layer 16 (doped with Si, carrier concentration: about $1\times10^{18}$ cm$^{-3}$, thickness: about 0.5 $\mu$m) are continuously formed on the n-GaAs substrate 10 by MOCVD.

Next, the growth process is suspended for a period of time, and the wafer is taken out of the MOCVD apparatus and then is subjected to patterning so that the center portion of the n-GaP current constriction layer 16 is etched away in a circular shape by using heated sulfuric acid. After the wafer is disposed in the MOCVD apparatus again, the re-growth process begins with the re-growth interface 20 located on the surface of the interface layer 15, and the p-GaP current diffusion layer 17 (doped with Zn, carrier concentration: about $2\times10^{15}$ cm$^{-3}$, thickness: about 5 $\mu$m) is grown on the patterned current constriction layer 16. Finally, the n-electrode 18 and the p-electrode 19 are respectively formed on the reverse surface of the substrate 10 and on the top surface of the grown layered structure.

Figure 8A:
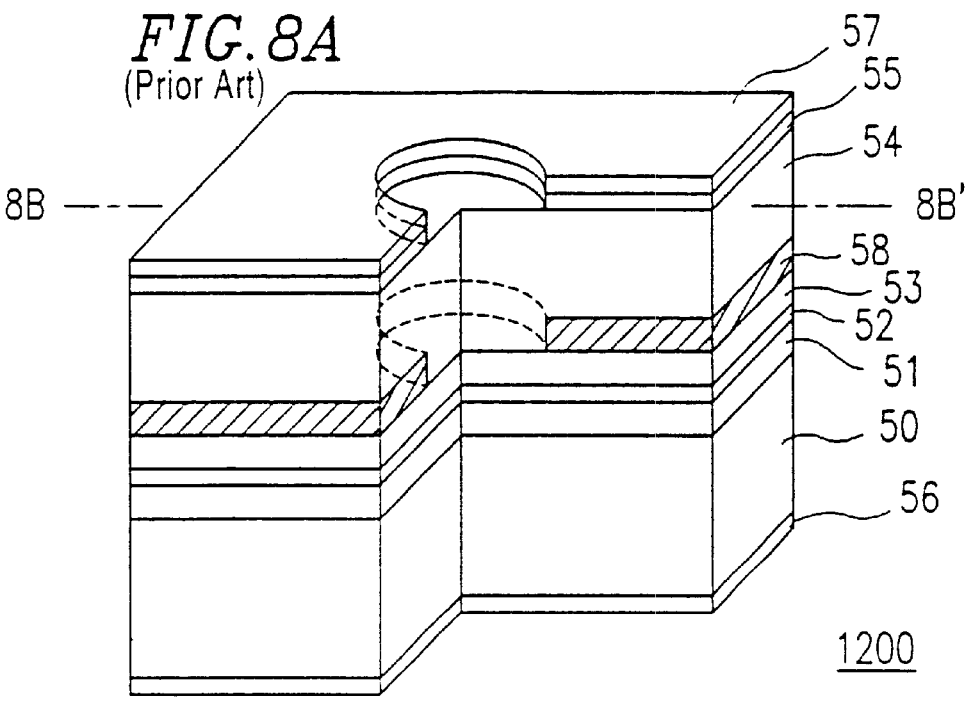
FIGS. 8A and 8B illustrate a conventional light emitting diode for communication.
Figure 8B:
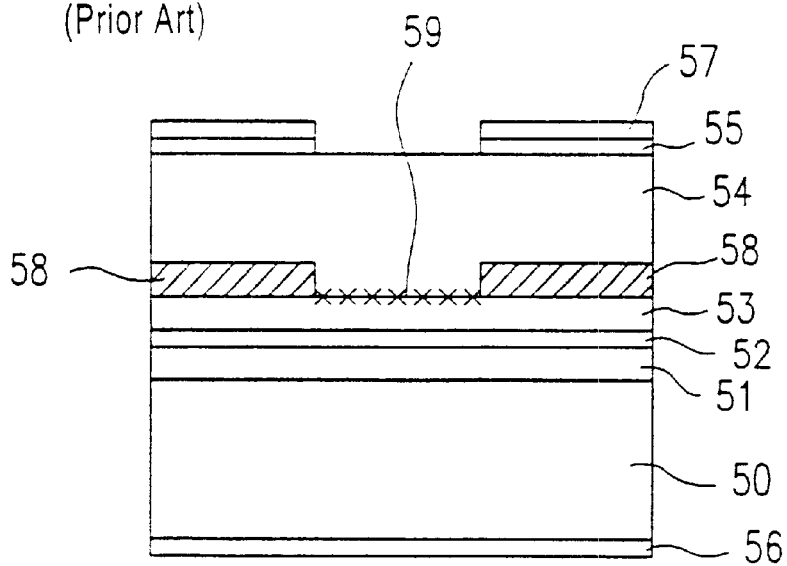
Figure 9:
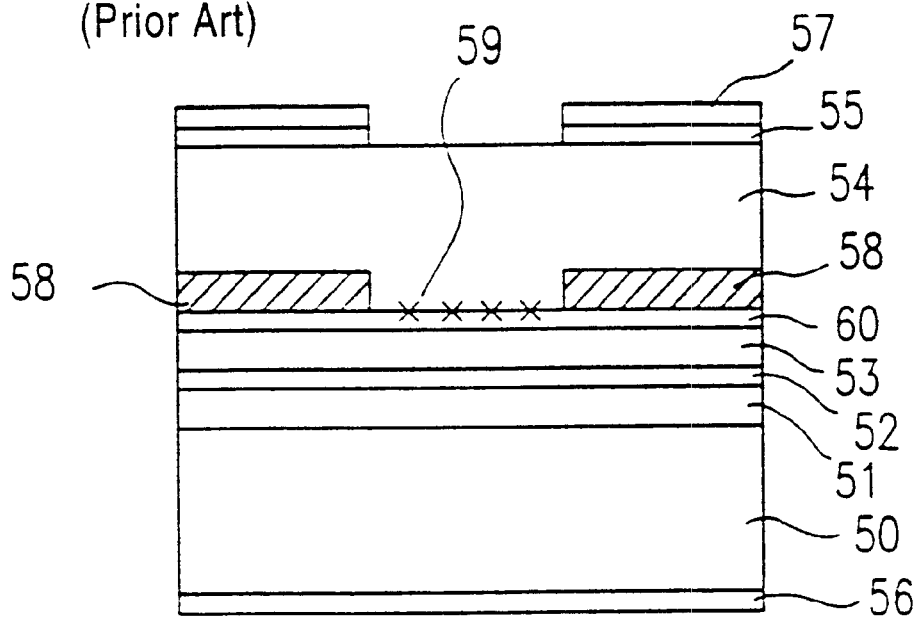
FIG. 9 is a schematic cross-sectional view of another conventional light emitting diode for illustrating a re-growth interface.

In this example, the underlying layer prior to the re-growth is not a p-AlGaInP cladding layer, as in the conventional element 1200 shown in FIGS. 8A and 8B, but the p-GaP interface layer 15 not containing Al. Therefore, the re-growth interface 20 is not oxidized. In addition, the p-GaP layers 15 and 17 made of the same semiconductor material having the same composition are formed with the re-growth interface 20 interposed therebetween, and therefore, no difference between the stoichiometries thereof is caused. As a result, the resistance is not increased and substantially no carriers are lost.

When the semiconductor light emitting element 100 of this example is molded with a resin and the operational characteristics thereof are measured, satisfactory results can be obtained: the luminescence thereof is about 32 cd (represented by an axial luminous intensity) and the operating voltage thereof is about 2.0 V.

Generally speaking, the n-GaAs substrate 10 corresponds to a compound semiconductor substrate of the first conductivity type, the n-GaAs buffer layer 11 corresponds to a buffer layer interposed between the compound semiconductor substrate of the first conductivity type and a light emitting layer; a multi-layer structure including the n-$(Al_{0.7}Ga_{0.3})_{0.5}In_{0.5}P$ cladding layer 12, the non-doped $(Al_{0.3}Ga_{0.7})_{0.5}In_{0.5}P$ active layer 13 and the p$(Al_{0.7}Ga_{0.3})_{0.5}In_{0.5}P$ cladding layer 14 corresponds to the light emitting layer, the p-GaP interface layer 15 not containing Al corresponds to a compound semiconductor interface layer having the second conductivity type and not containing Al, the n-GaP current constriction layer 16 corresponds to a current constriction layer having the first conductivity type and not containing Al, and the p-GaP current diffusion layer 17 corresponds to a current diffusion layer having the second conductivity type and being made of a compound semiconductor not containing Al.

Alternatively, the present invention is also applicable to a case where a light emitting layer has a double heterostructure including: an AlGaInP or AlInP cladding layer having the first conductivity type; an AlGaInP or GaInP active layer having the first or the second conductivity type or having no dopants; and an AlGaInP or AlInP cladding layer having the second conductivity type is used.

Moreover, the semiconductor light emitting element of the present invention is not limited to the yellow band emission. The present invention is applicable to red band emission in which an active layer is made of GaInP or $(Al_{0.5}Ga_{0.95})_{0.5}In_{0.5}P$ (the resulting wavelength is about 655 nm and about 644 nm, respectively), orange band emission in which an active layer is made of $(Al_{0.2}Ga_{0.8})_{0.5}In_{0.5}P$ (the resulting wavelength is about 610 nm), yellow band emission in which an active layer is made of $(Al_{0.38}Ga_{0.55})_{0.5}In_{0.5}P$ (the resulting wavelength is about 570 nm) and green band emission in which an active layer is made of $(Al_{0.45}Ga_{0.55})_{0.5}In_{0.5}P$ (the resulting wavelength is about 560 nm).

The composition of the cladding layer is not limited to $(Al_{0.7}Ga_{0.3})_{0.5}In_{0.5}P$, but may be $Al_{0.5}In_{0.5}P$. Furthermore, it is possible to form a semiconductor light emitting element in which the semiconductor substrate is of the p-type conductivity and the conductivity types of the respective layers are opposite to those described above.

Figure 2:
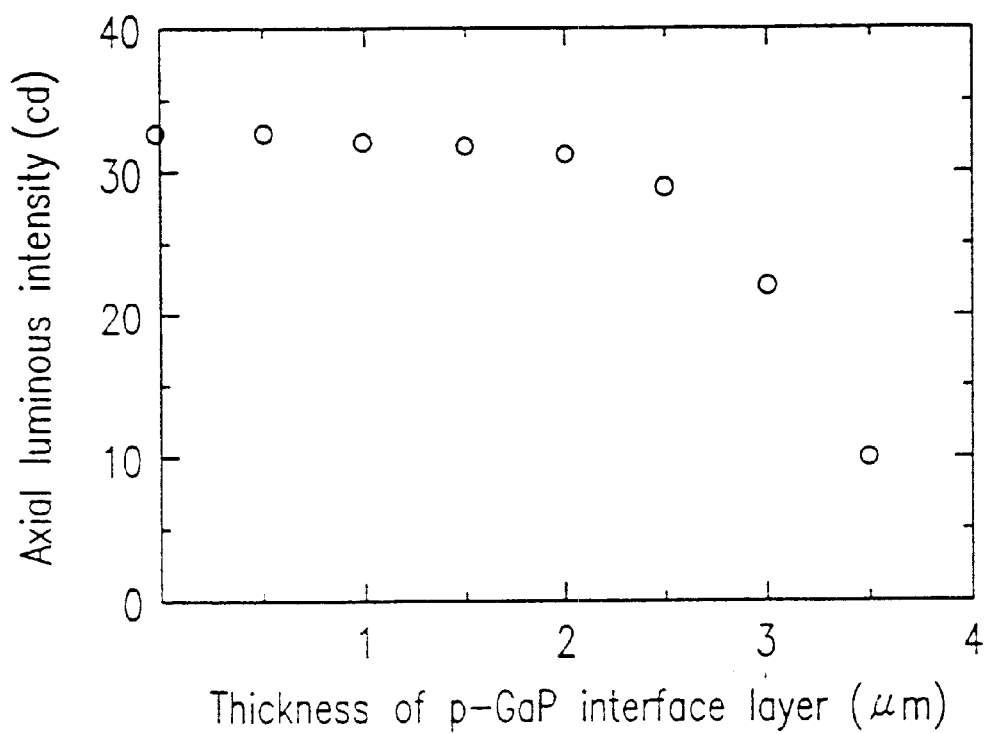
FIG. 2 is a graph showing the relationship between the axial luminous intensity and the thickness of the p-GaP interface layer functioning as an underlying layer prior to the re-growth in the semiconductor light emitting element in the first example of the present invention.

FIG. 2 shows the relationship between the axial luminous intensity and the thickness of the p-GaP interface layer 15 functioning as an underlying layer prior to the re-growth for the semiconductor light emitting element 100 of the present invention. The thickness of the p-GaP current diffusion layer 17 is assumed to be constant (at about 5 μm).

The point in the vicinity of the abscissa of zero represents that the thickness of the p-GaP interface layer 15 is approximately about 100 Å (=0.01 μm). The resulting axial luminous intensities are high (in the range from 31 cd to 33 cd) with respect to the thicknesses of the p-GaP interface layer 15 of about 0.5 μm, about 1.0 μm, about 1.5 μm and about 2.0 μm. However, when the thickness of the p-GaP interface layer 15 exceeds 2.5 μm and then 3.0 μm or more, the axial luminous intensity is dramatically decreased. This is presumably because a larger amount of current components are escaping into the surrounding regions underlying the upper electrode 19 within the p-GaP interface layer 15. Thus, the thickness of the p-GaP interface layer 15 is preferably in the range from about 0.01 μm to about 3.0 μm.

EXAMPLE 2

Figure 3A:
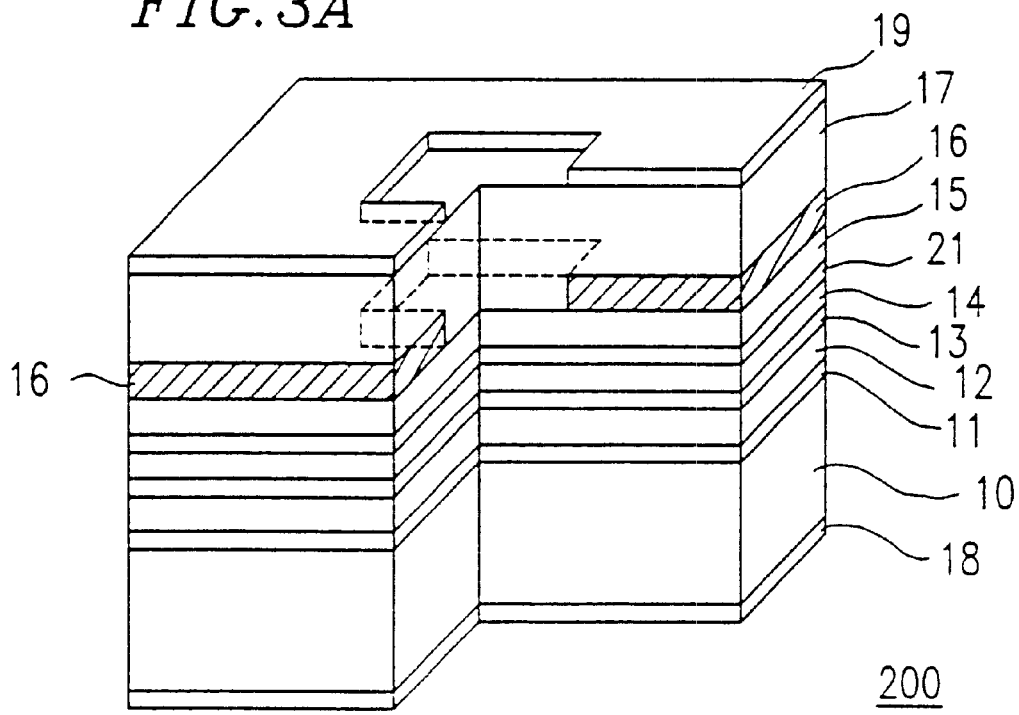
FIGS. 3A and 3B illustrate a semiconductor light emitting element in a second example of the present invention.
Figure 3B:
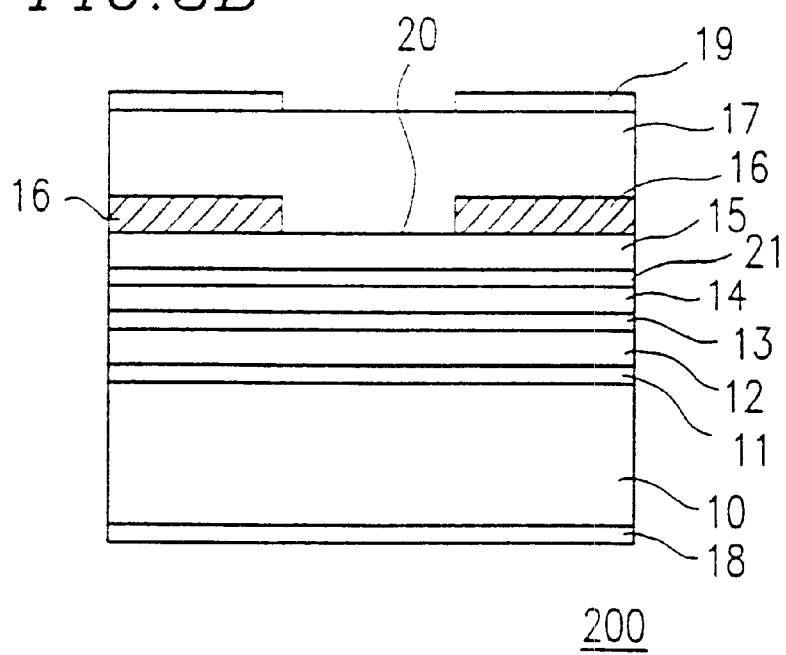

FIGS. 3A and 3B illustrate a semiconductor light emitting element 200 in the second example of the present invention: FIG. 3A is a schematic perspective view thereof; and FIG. 3B is a schematic cross-sectional view thereof.

The semiconductor light emitting element 200 in the second example of the present invention shown in FIGS. 3A and 3B is different from the semiconductor light emitting element 100 in the first example of the present invention shown in FIGS. 1A and 1B in that a p-$(Al_{0.2}Ga_{0.8})_{0.75}In_{0.25}P$ band gap adjustment layer 21 is interposed between the p-$(Al_{0.7}Ga_{0.3})_{0.5}In_{0.5}P$ cladding layer 14 and the p-GaP interface layer 15, and that openings in the light emitting region of the current constriction layer 16 and the electrode 19 are formed in a rectangular shape.

As shown in FIG. 3B, an n-GaAs buffer layer 11 (doped with Si, carrier concentration: about $5\times10^{17}$ cm$^{-3}$, thickness: about 0.5 μm), an n-$(Al_{0.7}Ga_{0.3})_{0.5}In_{0.5}P$ cladding layer 12 (doped with Si, carrier concentration: about $5\times10^{17}$ cm$^3$, thickness: about 1.5 μm), a non-doped $(Al_{0.3}Ga_{0.7})_{0.5}In_{0.5}P$ active layer 13 (thickness: about 0.7 μm), and a p-$(Al_{0.7}Ga_{0.3})_{0.5}In_{0.5}P$ cladding layer 14 (doped with Zn, carrier concentration: about $5\times10^{17}$ cm$^{-3}$, thickness: about 1.5 μm) are sequentially formed in this order on an n-GaAs substrate 10 by MOCVD. Next, a p-$(Al_{0.2}Ga_{0.8})_{0.75}In_{0.25}P$ band gap adjustment layer 21 (doped with Zn, carrier concentration: about $1\times10^{18}$ cm$^{-3}$, thickness: about 0.2 μm), a p-GaP layer 15 not containing Al (doped with Zn, carrier concentration: about $2\times10^{18}$ cm$^{-3}$, thickness: about 1.5 μm), and an n-GaP current constriction layer 16 (doped with Si, carrier concentration: about $1\times10^{18}$ cm$^3$, thickness: about 0.5 μm) are formed thereon.

Next, the growth process is suspended for a period of time, and the wafer is taken out of the MOCVD apparatus and then is subjected to patterning so that the center portion of the n-GaP current constriction layer 16 is etched away in a rectangular shape by using heated sulfuric acid. After the wafer is disposed in the MOCVD apparatus again, the re-growth process begins with the re-growth interface 20 located on the surface of the interface layer 15, and the p-GaP current diffusion layer 17 (doped with Zn, carrier concentration: about $3\times10^{18}$ cm$^{-3}$), thickness: about 5 μm) is formed on the patterned current constriction layer 16. Finally, an n-electrode 18 and a p-electrode 19 are formed on the reverse surface of the substrate 10 and on the top surface of the grown layered structure, respectively.

The n-GaP current constriction layer 16 has been etched so as to have a rectangular opening through the center portion thereof. The electrode 19 on the top surface of the structure also has a rectangular opening in the center portion thereof, which is shaped like a window for the egress of the emitted light.

The band gap adjustment layer (i.e., the p-$(Al_{0.2}Ga_{0.8})_{0.75}In_{0.25}P$ band gap adjustment layer) 21 has a band gap intermediate between the band gap of the underlying cladding layer (i.e., the p-$(Al_{0.7}Ga_{0.3})_{0.5}In_{0.5}P$ cladding layer) 14 and the band gap of the interface layer (i.e., the p-GaP layer) 15, and has a function of reducing the value of resistance in the interface between these layers 14 and 15. Specifically, the band gap of the cladding layer 14 is about 2.33 eV, the band gap of the band gap adjustment layer 21 is about 2.55 eV and the band gap of the p-GaP interface layer 15 is about 2.78 eV.

When the semiconductor light emitting element of the present invention shown in FIGS. 3A and 3B is molded with a resin and the operational characteristics thereof are measured, the luminescence is about 34 cd (represented by an axial luminous intensity) and the operating voltage is about 1.9 V.

In addition, the design rule of the band gap adjustment layer 21 can be considered as follows. Specifically, the energy position of the lower end of the conduction band of the band gap adjustment layer 21 prior to the junction formation is assumed to be located between the energy position of the lower end of the conduction band of the cladding layer 14 prior to the junction formation and the energy position of the lower end of the conduction band of the GaP interface layer 15 prior to the junction formation. In addition, the energy-position of the upper end of the valence band of the band gap adjustment layer 21 prior to the junction formation is assumed to be located between the energy position of the upper end of the valence band of the cladding layer 14 prior to the junction formation and the energy position of the upper end of the valence band of the GaP interface layer 15 prior to the junction formation.

Figure 4:
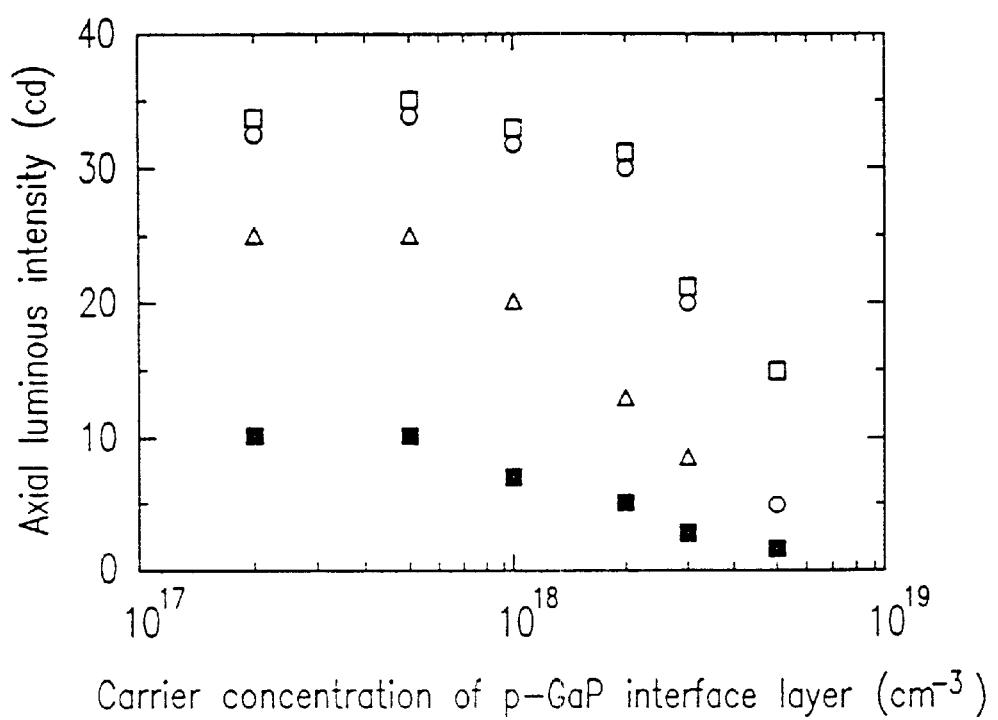
FIG. 4 is a graph representing the relationships between the carrier concentration of the p-GaP interface layer and the axial luminous intensity of the semiconductor light emitting element in the second example of the present invention, with the carrier concentration of the p-GaP current diffusion layer as parameters.

FIG. 4 is a graph representing the relationship between the carrier concentrations of the p-GaP interface layer 15 and the axial luminous intensity of the semiconductor light emitting element 200 having the structure shown in FIGS. 3A and 3B with the carrier concentration of the p-GaP current diffusion layer 17 as parameters.

In FIG. 4, when the carrier concentration of the p-GaP current diffusion layer 17 is about $5\times10^{17}$ cm$^{-3}$ (denoted by ■, i.e., by black squares), the carrier concentrations of the p-GaP interface layer 15 of about $2\times10^{17}$ cm$^{-3}$, about $5\times10^{17}$ cm$^{-3}$, about $1\times10^{18}$ cm$^{-3}$, about $2\times10^{18}$ cm$^{-3}$, about $3\times10^{18}$ cm$^{-3}$ and about $5\times10^{18}$ cm$^{-3}$ correspond to the axial luminous intensities of about 10 cd, about 10 cd, about 7 cd, about 5 cd, about 3 cd and about 2 cd, respectively. Similarly, when the carrier concentration of the p-GaP current diffusion layer 17 is about $1\times10^{18}$ cm$^{-3}$ (denoted by Δ, i.e., by white triangles), the axial luminous intensities of about 25 cd, about 25 cd, about 20 cd, about 13 cd, about 8 cd and about 2 cd correspond to the above-mentioned respective carrier concentrations of the p-GaP interface layer 15. When the carrier concentration of the p-GaP current diffusion layer 17 is about $2\times10^{18}$ cm$^{-3}$ (denoted by ○, i.e., by white circles), the axial luminous intensities of about 33 cd, about 34 cd, about 32 cd, about 30 cd, about 20 cd and about 5 cd correspond to the above-mentioned respective carrier concentrations of the p-GaP interface layer 15. Furthermore, when the carrier concentration of the p-GaP current diffusion layer 17 is about $5\times10^{18}$ cm$^3$ (denoted by □, i.e., by white squares), the axial luminous intensities of about 33 cd, about 35 cd, about 33 cd, about 30 cd, about 21 and about 15 cd correspond to the above-mentioned respective carrier concentrations of the p-GaP interface layer 15.

From the results shown in FIG. 4, it can be seen that when the carrier concentration of the p-GaP interface layer 15 (i.e., the compound semiconductor interface layer having the second conductivity type and not containing Al) is low and the carrier concentration of the p-GaP current diffusion layer 17 (i.e., the current diffusion layer having the second conductivity type and being made of a compound semiconductor not containing Al) is high, the resulting luminous intensity is high. Specifically, the appropriate carrier concentration range of the p-GaP interface layer 15 is equal to or lower than about $2\times10^{18}$ cm$^{-3}$, and the appropriate carrier concentration range of the p-GaP current diffusion layer 17 is equal to or higher than about $2\times10^{18}$ cm$^{-3}$. When the carrier concentration of the p-GaP interface layer 15 becomes lower than about $2\times10^{16}$ cm$^{-3}$, the operating voltage is increased. Thus, the lower limit of the optimum carrier concentration range of the p-GaP interface layer 15 is presumably about $2\times10^{16}$ cm$^{-3}$.

EXAMPLE 3

Figure 5:
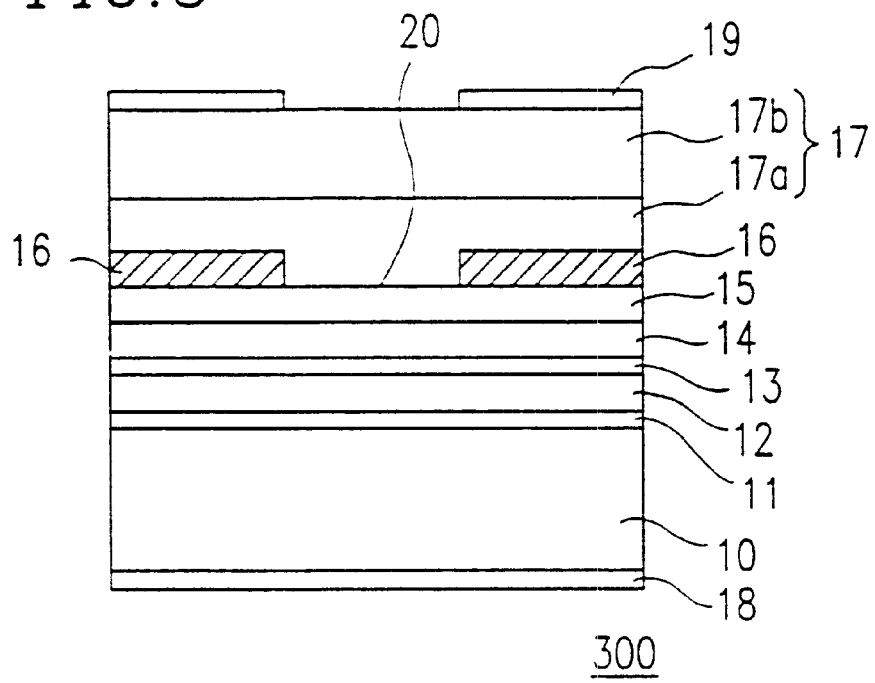
FIG. 5 is a schematic cross-sectional view of a semiconductor light emitting element in a third example of the present invention.

FIG. 5 is a schematic cross-sectional view of a semiconductor light emitting element 300 in the third example of the present invention.

The semiconductor light emitting element 300 in the third example of the present invention shown in FIG. 5 is different from the semiconductor light emitting element 100 in the first example of the present invention shown in FIGS. 1A and 1B in that the p-GaP current diffusion layer 17 (i.e., the current diffusion layer having the second conductivity type and being made of a compound semiconductor not containing Al) has a double-layer structure. The lower part 17a of the p-GaP current diffusion layer 17 is doped with Zn, and has a carrier concentration of about $1\times10^{18}$ cm$^{-3}$ and a thickness of about 2 μm. The upper part 17b of the p-GaP current diffusion layer 17 is doped with Zn, and has a carrier concentration of about $3\times10^{18}$ cm$^{-3}$ and a thickness of about 3 μm.

As shown in FIG. 5, an n-GaAs buffer layer 11 (doped with Si, carrier concentration: about $5\times10^{17}$ cm$^{-3}$, thickness: about 0.5 μm), an n-$(Al_{0.7}Ga_{0.3})_{0.5}In_{0.5}P$ cladding layer 12 (doped with Si, carrier concentration: about $5\times10^{17}$ cm$^{-3}$, thickness: about 1.5 μm), a non-doped $(Al_{0.3}Ga_{0.7})_{0.5}In_{0.5}P$ active layer 13 (thickness: about 0.7 μm), and a p-$(Al_{0.7}Ga_{0.3})_{0.5}In_{0.5}P$ cladding layer 14 (doped with Zn, carrier concentration: about $5\times10^{17}$ cm$^{-3}$, thickness: about 1.5 μm) are sequentially formed in this order on an n-GaAs substrate 10 by MOCVD. Next, a p-GaP interface layer 15 not containing Al (doped with Zn, carrier concentration: about $1\times10^{18}$ cm$^{-3}$, thickness: about 2 μm) and an n-GaP current constriction layer 16 (doped with Si, carrier concentration: about $1\times10^{18}$ cm$^{-3}$, thickness: about 0.5 μm) are formed thereon.

Next, the growth process is suspended for a period of time, and the wafer is taken out of the MOCVD apparatus and then is subjected to patterning so that the center portion of the n-GaP current constriction layer 16 is etched away in a circular shape by using heated sulfuric acid. After the wafer is disposed in the MOCVD apparatus again, the re-growth process begins with the re-growth interface 20 located on the surface of the interface layer 15, and the first p-GaP current diffusion layer 17a (doped with Zn, carrier concentration: about $1\times10^{18}$ cm$^3$, thickness: about 2 μm) and a second p-GaP current diffusion layer 17b (doped with Zn, carrier concentration: about $3\times10^{18}$ cm$^{-3}$, thickness: about 3 μm) are formed as the double-layered p-GaP current diffusion layer 17 over the patterned current constriction layer 16. Finally, an n-electrode 18 and a p-electrode 19 are formed on the reverse surface of the substrate 10 and on the top surface of the grown layered structure, respectively.

The n-GaP current constriction layer 16 has been etched so as to have a circular opening in the center portion thereof, as shown in FIG. 5. The electrode 19 on the top surface of the structure also has a circular opening in the center portion thereof, which is shaped like a window for the egress of the emitted light therethrough.

In this element structure, the boundary between the GaP interface layer and the GaP current diffusion layer equivalently corresponds to the boundary between the first p-GaP current diffusion layer 17a and the second p-GaP current diffusion layer 17b in view of the carrier concentrations thereof. In other words, the semiconductor light emitting element 300 of the present example has a structure in which the carrier concentration of the current diffusion layer 17, having the second conductivity type and being made of a compound semiconductor not containing Al, increases from the part over the compound semiconductor interface layer 15 toward the region under the upper electrode 19.

When the semiconductor light emitting element 300 of the present invention is molded with a resin and the operational characteristics thereof are measured, the resulting operational characteristics are also satisfactory: the luminescence is about 35 cd (represented by an axial luminous intensity) and the operating voltage is about 1.9 V.

EXAMPLE 4

Figure 6:
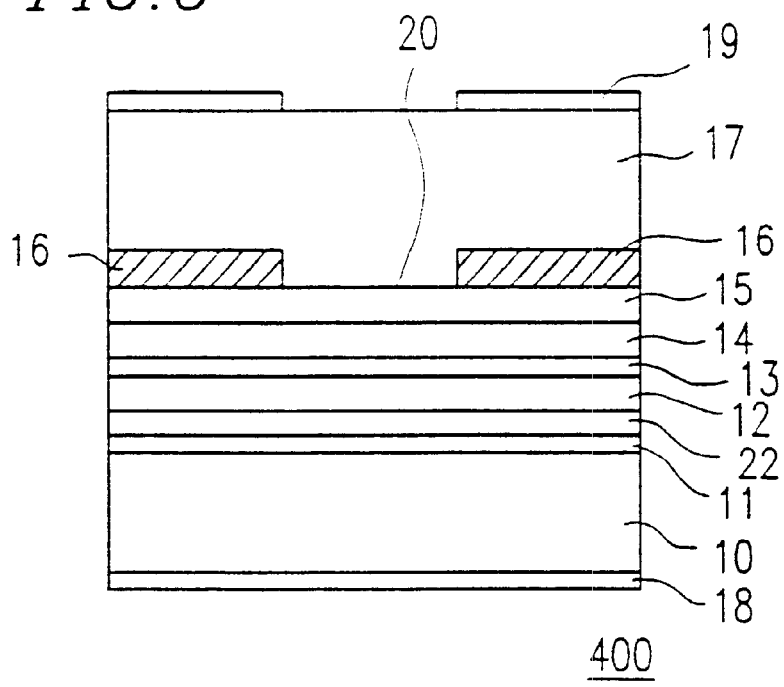
FIG. 6 is a schematic cross-sectional view of a semiconductor light emitting element in a fourth example of the present invention.
Figure 7A:
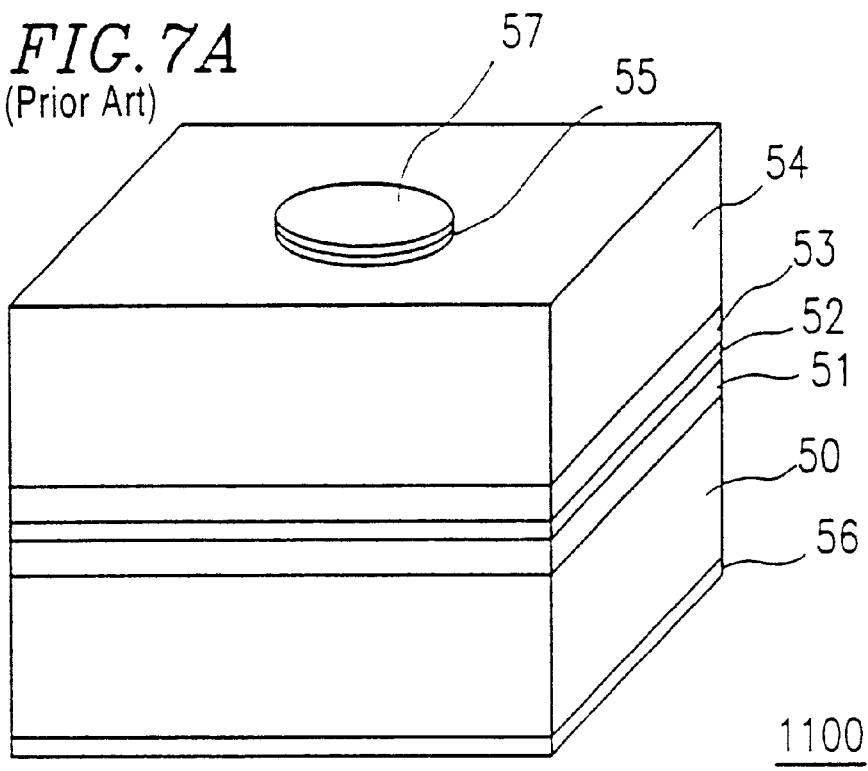
FIGS. 7A and 7B illustrate a conventional quadruple-alloy light emitting diode for a yellow band.
Figure 7B:
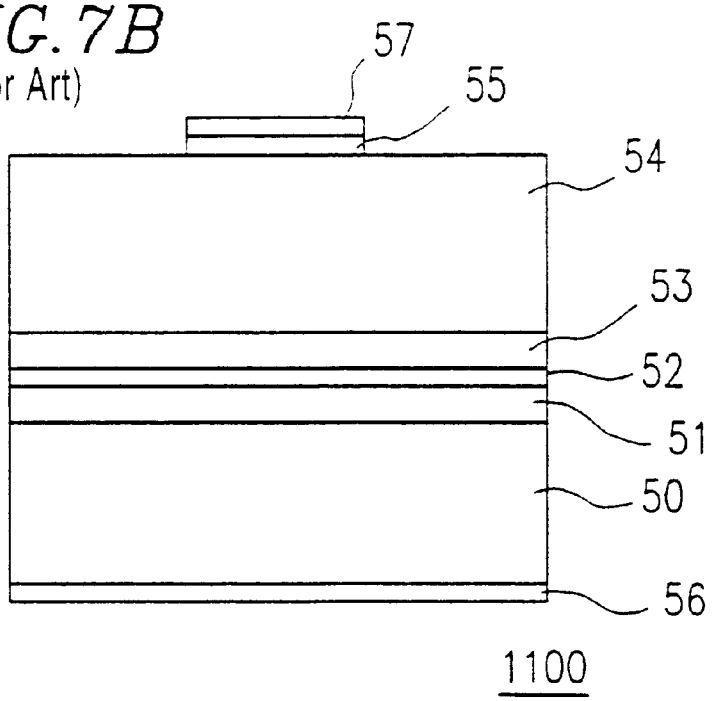

FIG. 6 is a schematic cross-sectional view of a semiconductor light emitting element 400 in the fourth example of the present invention.

The semiconductor light emitting element 400 in the fourth example of the present invention shown in FIG. 6 is different from the semiconductor light emitting element 100 in the first example of the present invention shown in FIGS. 1A and 1B in that a light reflective layer 22, in which 10 pairs of n-$Al_{0.5}In_{0.5}P$ layers (doped with Si, carrier concentration: about $5 \times 10^{17}$ $cm^{-3}$, thickness: about 0.5 $\mu m$) and ($Al_{0.4}Ga_{0.6})_{0.5}In_{0.5}P$ layers (doped with Si, carrier concentration: about $5 \times 10^{17}$ $cm^{-3}$, thickness: about 0.5 $\mu m$) are alternately formed, is provided between the n-GaAs buffer layer 11 (doped with Si, carrier concentration: about $5 \times 10^{17}$ $cm^{-3}$, thickness: about 0.5 $\mu m$) and the n-$(Al_{0.7}Ga_{0.3})_{0.5}In_{0.5}P$ cladding layer 12 (doped with Si, carrier concentration: about $5 \times 10^{17}$ $cm^{-3}$, thickness: about 1.5 $\mu m$).

When the semiconductor light emitting element 400 of the present invention is molded with a resin and the operational characteristics thereof are measured, the resulting operational characteristics are also satisfactory: the luminescence is about 48 cd (represented by an axial luminous intensity) and the operating voltage is about 1.9 V.

In FIG. 6, the reference numeral 10 denotes the n-GaAs substrate, 11 denotes the n-GaAs buffer layer, 12 denotes the n-$(Al_{0.7}Ga_{0.3})_{0.5}In_{0.5}P$ cladding layer, 13 denotes a non-doped $(Al_{0.3}Ga_{0.7})_{0.5}In_{0.5}P$ active layer, 14 denotes a p-$(Al_{0.7}Ga_{0.3})_{0.5}In_{0.5}P$ cladding layer, 15 denotes a p-GaP interface layer not containing Al, 16 denotes an n-GaP current constriction layer, 17 denotes a p-GaP current diffusion layer, 18 denotes an n-electrode on the reverse surface of the substrate 10, 19 denotes a p-electrode on the top surface of the grown layered structure, 20 denotes a re-growth interface and 22 denotes the light reflective layer. The carrier concentrations and the thicknesses of the respective layers, except for the light reflective layer 22, are the same as those described with reference to FIGS. 1A and 1B.

The process for fabricating the semiconductor light emitting element 400 in this example is similar to those used in the previously-mentioned examples. The explanation therefor is accordingly omitted herein.

Generally speaking, in this semiconductor light emitting element 400, a semiconductor layer 22 providing a light reflection function is interposed between the compound semiconductor substrate having the first conductivity type (n-GaAs substrate) 10 and a light emitting layer. The light emitting layer corresponds to the n-$(Al_{0.7}Ga_{0.3})_{0.5}In_{0.5}P$ cladding layer 12, the non-doped $(Al_{0.3}Ga_{0.7})_{0.5}In_{0.5}P$ active layer 13 and the p$(Al_{0.7}Ga_{0.3})_{0.5}In_{0.5}P$ cladding layer 14.

As has been described above, the semiconductor light emitting element of the present invention includes: a compound semiconductor substrate having a first conductivity type; a light emitting layer; a compound semiconductor interface layer having a second conductivity type and not containing Al; and a current diffusion layer having the second conductivity type and being made of a compound semiconductor not containing Al. By utilizing such a structure, it is possible to provide a semiconductor light emitting element having a low resistance and a high luminescence intensity, in which oxygen is not absorbed into the re-growth interface between the compound semiconductor interface layer and the current diffusion layer, both of which do not contain Al.

In the semiconductor light emitting element of the present invention, a current constriction layer, having the first conductivity type and being made of a compound semiconductor not containing Al, may be formed between the compound semiconductor interface layer and the current diffusion layer. In such a structure, current can be concentrated into a narrow region. As a result, the spot size of the emitted light can be reduced, and therefore, a semiconductor light emitting element having an increased luminescence intensity is realized. Consequently, the light concentration characteristics of the resulting semiconductor light emitting element, which has been molded, can be improved and the axial luminous intensity thereof can be increased.

Moreover, in the semiconductor light emitting element, the carrier concentration of the current diffusion layer may increase from a region thereof over the compound semiconductor interface layer toward a region thereof under an upper electrode. In such a structure, the impurities producing the second conductivity type do not diffuse through the current diffusion layer and the cladding layer into the active layer so that the crystallinity of the element is not deteriorated, and therefore, the luminescence intensity of the element is not decreased.

Furthermore, the light emitting layer in the semiconductor light emitting element of the present invention may have a double herersostructure in which an AlGaInP or AlInP cladding layer having the first conductivity type, an AlGaInP or AlInP have a large band gap and are likely to be oxidized so as to generate a non-radiative level. However, according to the present invention, since the compound semiconductor interface layer having the second conductivity type and being made of a compound semiconductor not containing Al is formed thereon, a remarkable oxidization inhibition effect can be obtained.

Furthermore, in the semiconductor light emitting element of the present invention, a semiconductor layer providing a light reflection function may be interposed between the compound semiconductor substrate and the light emitting layer. In such a structure, the light emitted toward the substrate can be reflected so as to be emitted out of the semiconductor light emitting element, and therefore, the luminescence intensity of the element can be increased.

Furthermore, in the semiconductor light emitting element of the present invention, a band gap adjustment layer having an intermediate band gap may be provided between the light emitting layer and the compound semiconductor interface layer. In such a structure, a resistance between the light emitting layer and the compound semiconductor interface layer can be reduced, and therefore, the operating voltage of the element can also be reduced.

Furthermore, in the semiconductor light emitting element of the present invention, a buffer layer may be provided between the compound semiconductor substrate and the light emitting layer. In such a structure, the crystallinity of the light emitting layer to be grown on the buffer layer can be improved, and therefore, the luminescence intensity of the element can be increased.

Furthermore, in the semiconductor light emitting element of the present invention, each of the compound semiconductor interface layer, the current constriction layer, and the current diffusion layer may be made of the GaP compound material. Thus, the generation of an interface level owing to the difference in stoichiometries can be prevented and substantially no carriers are lost in the interface. As a result, the luminescence intensity of the element can be increased.

Furthermore, in the semiconductor light emitting element of the present invention, the current constriction layer may have an opening in a center portion of the semiconductor light emitting element. In such a structure, current can be concentrated into the center portion, and therefore, a small and highly concentrated light spot can be formed in the center portion of the element. Thus, a semiconductor light emitting element having a high luminescence intensity can be provided. Consequently, the light concentration characteristics of the molded element are considerably improved and the axial luminous intensity thereof can be further increased.

Furthermore, in the semiconductor light emitting element of the present invention, a thickness of the compound semiconductor interface layer may be equal to or smaller than 3.0 $\mu$m. In such a structure, the current components diffusing from the center portion of the element toward the surrounding portions can be reduced in the compound semiconductor interface layer, and therefore, the luminescence intensity in the center portion of the element can be further increased.

Furthermore, in the semiconductor light emitting element of the present invention, the compound semiconductor interface layer may have a carrier concentration in a range from about $2 \times 10^{16}$ cm$^{-3}$ to about $2 \times 10^{18}$ cm$^{-3}$, and the current diffusion layer may have a carrier concentration of about $2 \times 10^{18}$ cm$^{-3}$ or more. In such a structure, it is possible to surely prevent impurities which produce the second conductivity type from diffusing toward the light emitting layer. The current can be diffused more satisfactorily, resulting in the increased luminescence intensity of the element.

According to the method for fabricating a semiconductor light emitting element of the present invention, a re-growth interface is located on the surface of the compound semiconductor interface layer. Thus, the method can reduce the amount of oxygen absorbed into the re-growth interface.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor light emitting element, wherein the semiconductor light emitting element includes:

a compound semiconductor substrate having a first conductivity type;

a light emitting layer;

a compound semiconductor interface layer having a second conductivity type and not containing Al; and a current diffusion layer having the second conductivity type and being made of the same compound semiconductor material as that of the compound semiconductor interface layer, and the method comprises the steps of:

forming the light emitting layer and the compound semiconductor interface layer on the compound semiconductor substrate; and forming the current diffusion layer over the compound semiconductor interface layer, wherein a growth process is suspended at a predetermined time so that a re-growth interface is located on a surface of the compound semiconductor interface layer.

2. A method according to claim 1, further comprising:

forming a current constriction layer between the compound semiconductor interface layer and the current diffusion layer.

3. A method for fabricating a semiconductor light emitting element, wherein the semiconductor light emitting element includes:

a compound semiconductor substrate having a first conductivity type;

a light emitting layer;

a compound semiconductor interface layer having a second conductivity type and not containing Al; and a current diffusion layer having the second conductivity type and being made of a compound semiconductor not containing Al, and the method comprises the steps of:

forming the light emitting layer and the compound semiconductor interface layer on the compound semiconductor substrate; and forming the current diffusion layer over the compound semiconductor interface layer, wherein a growth process is suspended at a predetermined time so that a re-growth interface is located on a surface of the compound semiconductor interface layer, and wherein the current constriction layer has the first conductivity type and is formed of a compound semiconductor not containing Al.

4. A method for fabricating a semiconductor light emitting element, wherein the semiconductor light emitting element includes:

a compound semiconductor substrate having a first conductivity type;

a light emitting layer;

a compound semiconductor interface layer having a second conductivity type and not containing Al; and a current diffusion layer having the second conductivity type and being made of a compound semiconductor not containing Al, and the method comprises the steps of:

forming the light emitting layer and the compound semiconductor interface layer on the compound semiconductor substrate; and forming the current diffusion layer over the compound semiconductor interface layer, wherein a growth process is suspended at a predetermined time so that a re-growth interface is located on a surface of the compound semiconductor interface layer, and wherein the compound semiconductor interface layer, the current constriction layer and the current diffusion layer are made of the same compound semiconductor material.

5. A method according to claim 2, further comprising:

forming an electrode layer on the current diffusion layer, wherein an opening in the electrode layer is aligned with an opening in the current constriction layer.

6. A method according to claim 1, further comprising:

forming an electrode layer on the current diffusion layer.

7. A method for fabricating a semiconductor light emitting element, wherein the semiconductor light emitting element includes;

a compound semiconductor substrate having a first conductivity type;

a light emitting layer;

a compound semiconductor interface layer having a second conductivity type and not containing Al; and a current diffusion layer having the second conductivity type and being made of a compound semiconductor not containing Al, and the method comprises the steps of:

forming the light emitting layer and the compound semiconductor interface layer on the compound semiconductor substrate; and forming the current diffusion layer over the compound semiconductor interface layer, wherein a growth process is suspended at a predetermined time so that a re-growth interface is located on a surface of the compound semiconductor interface layer, and wherein a carrier concentration of the current diffusion layer increases from a region thereof over the compound semiconductor interface layer toward a region thereof under the electrode layer.

8. A method according to claim 1, wherein the light emitting layer has a double heterostructure in which an AlGaInP or AlInP cladding layer having the first conductivity type, an AlGaInP or GaInP active layer, and an AlGaInP or AlInP cladding layer having the second conductivity type are sequentially formed in this order.

9. A method according to claim 1, wherein a thickness of the compound semiconductor interface layer is equal to or smaller than about 3.0 micrometers.

10. A method according to claim 1, wherein the compound semiconductor interface layer has a carrier concentration in a range from about $2 \times 10^{16}$ cm$^{-3}$ to about $2 \times 10^{18}$ cm$^{-3}$, and the current diffusion layer has a carrier concentration of about $2 \times 10^{18}$ cm$^{-3}$ or more.

* * * * *